(12) United States Patent
Kim et al.

(10) Patent No.: US 8,149,503 B2
(45) Date of Patent: Apr. 3, 2012

(54) REFLECTIVE SEMICONDUCTOR OPTICAL AMPLIFIER AND OPTICAL SIGNAL PROCESSING METHOD USING THE SAME

(75) Inventors: Hyun Soo Kim, Daejeon (KR); O-Kyun Kwon, Daejeon (KR); Dong Churl Kim, Daejeon (KR); Byung-Seok Choi, Daejeon (KR); Kisoo Kim, Daejeon (KR); Dae Kon Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 567 days.

(21) Appl. No.: 12/367,431

(22) Filed: Feb. 6, 2009

(65) Prior Publication Data

US 2010/0092175 A1   Apr. 15, 2010

(30) Foreign Application Priority Data

Oct. 10, 2008   (KR) .................. 10-2008-0099613

(51) Int. Cl.
 *H01S 3/131* (2006.01)
 *H04J 14/02* (2006.01)
 *H04B 10/17* (2006.01)

(52) U.S. Cl. .......................................... 359/344; 398/70

(58) Field of Classification Search .................. 359/344, 359/237, 248; 398/66, 68, 70; *H01S 3/063; H04B 10/17*
See application file for complete search history.

(56) References Cited

U.S. PATENT DOCUMENTS

| | | | | |
|---|---|---|---|---|
| 3,951,513 A * | 4/1976 | Masi | ................ | 385/8 |
| 5,103,456 A * | 4/1992 | Scifres et al. | ............ | 372/50.22 |
| 5,105,301 A * | 4/1992 | Campi | ...................... | 359/245 |
| 5,229,879 A * | 7/1993 | Gen-ei | .................. | 359/344 |
| 5,307,200 A * | 4/1994 | Yoshida | ................ | 359/248 |
| 5,390,210 A * | 2/1995 | Fouquet et al. | .............. | 372/92 |
| 5,424,559 A * | 6/1995 | Kasahara | ................. | 257/21 |
| 6,188,511 B1 * | 2/2001 | Marcenac et al. | ........ | 359/344 |
| 6,649,938 B1 * | 11/2003 | Bogatov et al. | .............. | 257/95 |
| 7,099,530 B2 * | 8/2006 | Shin et al. | .................. | 385/27 |
| 7,123,406 B2 * | 10/2006 | Shin et al. | ................. | 359/344 |
| 7,123,407 B2 * | 10/2006 | Byun et al. | ................ | 359/344 |
| 7,126,749 B2 * | 10/2006 | Heim et al. | ................ | 359/344 |

(Continued)

FOREIGN PATENT DOCUMENTS

KR   2003-0077089 A   10/2003

(Continued)

OTHER PUBLICATIONS

Zhaowen Xu et al., "10 Gb/s WDM-PON upstream transmission using injection-locked Fabry-Perot laser diodes", Optical Fiber Communication Conference, 2006 and the 2006 National Fiber Optic Engineers Conference. OFC 2006, Mar. 5-6, 2006.

(Continued)

*Primary Examiner* — Mark Hellner
*Assistant Examiner* — Ari M Diacou
(74) *Attorney, Agent, or Firm* — Rabin & Berdo, P.C.

(57) ABSTRACT

Provided are a semiconductor optical amplifier and an optical signal processing method using the same. The reflective semiconductor optical amplifier includes: an optical signal amplification region operating to allow a downward optical signal incident from the external to obtain a gain; and an optical signal modulation region connected to the optical signal amplification region and generating a modulated optical signal. The downward optical signal is amplified through a cross gain modulation using the modulated optical signal and is outputted as an upward optical signal.

17 Claims, 5 Drawing Sheets

U.S. PATENT DOCUMENTS

| | | | |
|---|---|---|---|
| 7,173,757 B2* | 2/2007 | Kim et al. | 359/344 |
| 7,224,519 B2* | 5/2007 | Shin et al. | 359/344 |
| 7,274,010 B2* | 9/2007 | Matsuda et al. | 250/214 LA |
| 7,352,941 B2* | 4/2008 | Bratkovski et al. | 385/129 |
| 7,453,629 B2* | 11/2008 | Dai et al. | 359/344 |
| 7,679,819 B2* | 3/2010 | Kim et al. | 359/344 |
| 7,692,853 B2* | 4/2010 | Dai et al. | 359/344 |
| 7,941,055 B2* | 5/2011 | Huang et al. | 398/158 |
| 2003/0137722 A1* | 7/2003 | Nikolajsen et al. | 359/341.1 |
| 2003/0231382 A1* | 12/2003 | Ahn et al. | 359/344 |
| 2004/0032647 A1* | 2/2004 | Wasserbauer | 359/344 |
| 2004/0120028 A1* | 6/2004 | Heim et al. | 359/344 |
| 2005/0063704 A1* | 3/2005 | Lee et al. | 398/66 |
| 2005/0078359 A1* | 4/2005 | Kim et al. | 359/344 |
| 2005/0088724 A1* | 4/2005 | Lee et al. | 359/333 |
| 2005/0105171 A1* | 5/2005 | Shin et al. | 359/344 |
| 2005/0185264 A1 | 8/2005 | Shin et al. | |
| 2006/0024066 A1* | 2/2006 | Fujiwara et al. | 398/183 |
| 2006/0093360 A1* | 5/2006 | Kim et al. | 398/71 |
| 2007/0153365 A1* | 7/2007 | Dai et al. | 359/344 |
| 2007/0183788 A1* | 8/2007 | Kim et al. | 398/160 |
| 2008/0137178 A1* | 6/2008 | Chung et al. | 359/321 |
| 2008/0267243 A1* | 10/2008 | Wang et al. | 372/69 |
| 2008/0310013 A1* | 12/2008 | Dai et al. | 359/344 |
| 2010/0158524 A1* | 6/2010 | Kwon et al. | 398/70 |
| 2010/0303123 A1* | 12/2010 | Li | 372/98 |
| 2011/0013270 A1* | 1/2011 | Tanaka | 359/344 |

FOREIGN PATENT DOCUMENTS

KR 20070061119 A 6/2007

OTHER PUBLICATIONS

Idelfonso Tafur Monroy et al., "85 km Long Reach PON System Using a Reflective SOA-EA Modulator and Distributed Raman Fiber Amplification" Lasers and Electro-Optics Society, 2006. LEOS 2006. 19th Annual Meeting of the IEEE Oct. 2006, pp. 705-706.

* cited by examiner

REFLECTIVE SEMICONDUCTOR OPTICAL AMPLIFIER AND OPTICAL SIGNAL PROCESSING METHOD USING THE SAME

CROSS-REFERENCE TO RELATED APPLICATIONS

This U.S. non-provisional patent application claims priority under 35 U.S.C. §119 of Korean Patent Application No. 10-2008-0099613, filed on Oct. 10, 2008, the entire contents of which are hereby incorporated by reference.

BACKGROUND OF THE INVENTION

The present invention disclosed herein relates to a semiconductor optical amplifier and an optical signal processing method using the same, and more particularly, to a semiconductor optical amplifier using a cross gain modulation and an optical signal processing method using the same.

As high speed internet and diverse multimedia services are introduced lately, Fiber To The Home (FTTH) technology for connecting a telephone station to a home through an optical fiber has been actively developed in order to provide a large amount of information to a user. To commercially use this technology, it is necessary to transmit a large amount of information and achieve a low cost for realizing it.

In general, because a Passive Optical Network (PON) is based on a passive device, it is advantageous in an aspect of network maintenance and management. Furthermore, since a large number of subscribers share an optical fiber in the PON, it is economical. Especially, according to a Wavelength Division Multiplexed-Passive Optical Network (WDM-PON), since respectively different wavelengths are allocated to each subscriber, its security and expandability are excellent.

However, according to the WDM-PON, a very expensive optical source such as Distributed Feedback Laser Diode (DFB-LD) is required for each subscriber to use respectively different wavelengths. Furthermore, to achieve a rapid troubleshooting and effective wavelength management, a provider of the WDM-PON preliminarily prepares optical sources of a specific wavelength allocated to each subscriber. That is, if a wavelength dependable optical source is used, a price competitive WDM-PON may be difficult to realize.

Accordingly, researches for using a low-cost wavelength independent optical source such as a reflective semiconductor optical amplifier as an optical source of an Optical Network Terminal (ONT) in the WDM-PON have been actively progressed.

SUMMARY OF THE INVENTION

The present invention provides an inexpensive and high operating speed reflective semiconductor amplifier.

Embodiments of the present invention provide reflective semiconductor optical amplifiers including: an optical signal amplification region operating to allow a downward optical signal incident from the external to obtain a gain; and an optical signal modulation region connected to the optical signal amplification region and generating a modulated optical signal, wherein the downward optical signal is amplified through a cross gain modulation using the modulated optical signal and is outputted as an upward optical signal.

In some embodiments, the optical signal amplification region includes a semiconductor amplifier and the optical signal modulation region includes a laser diode, and the optical signal amplification region and the optical signal modulation region include a first electrode and second electrode, respectively, the first electrode and second electrode being configured to allow independent current injection.

In other embodiments, a direct current is applied to the first electrode of the optical signal amplification region and a Radio Frequency (RF) current is applied to the second electrode of the optical signal modulation region.

In still other embodiments, the optical signal modulation region generates an optical signal modulated by the RF current, and the optical signal amplification region performs the cross-gain modulation on the downward optical signal through the modulated optical signal and then outputs the cross-gain modulated downward optical signal as an upward optical signal.

In even other embodiments, a wavelength band of the upward optical signal is included in a gain band of the semiconductor amplifier and is different from that of the downward optical signal.

In yet other embodiments, the optical signal modulation region includes a diffraction grating.

In further embodiments, the optical signal modulation region oscillates a light of a single wavelength.

In still further embodiments, the reflective semiconductor optical amplifiers further include: an anti-reflective layer disposed adjacent to the optical signal amplification region; and a reflective layer disposed adjacent to the optical signal modulation region. The optical signal amplification region and the optical signal modulation region are interposed between the anti-reflective layer and the reflective layer.

In even further embodiments, the anti-reflective layer receives the incident downward optical signal and outputs the upward optical signal.

In yet further embodiments, the reflective semiconductor optical amplifiers further include a spot-size converter interposed between the optical signal amplification region and the anti-reflective layer, wherein the anti-reflective layer is optically connected to one optical fiber.

In other embodiments of the present invention, reflective semiconductor optical amplifiers include: an anti-reflective layer serving as an input/output path of light; a reflective layer spaced apart from the anti-reflective layer, the reflective layer reflecting the light; and an optical amplification modulation region having a resonant structure between the anti-reflective layer and the reflective layer.

In some embodiments, the resonant structure of the optical amplification modulation region generates a resonant frequency of a single wavelength.

In other embodiments, the optical amplification region includes a semiconductor amplifier operating to allow the light to obtain a gain and a laser diode generating a modulated signal, the semiconductor amplifier and the laser diode being connected in series.

In still other embodiments, a band of an oscillation wavelength of the laser diode is included in a gain band of the semiconductor amplifier and is different from a wavelength band of the light.

In still other embodiments of the present invention, methods for processing an optical signal of a wavelength division multiplexed-passive optical network (WDM-PON) including a central office and an optical network terminal include: receiving a downward optical signal from the central office; generating a modulated optical signal; and amplifying the downward optical signal through a cross gain modulation using the modulated optical signal and outputting the amplified downward optical signal as an upward optical signal.

In some embodiments, a wavelength band of the modulated optical signal is included in a gain band of the amplification but is different from that of the downward optical signal.

In other embodiments, a wavelength band of the modulated optical signal is another wavelength band that is not used in the WDM-PON.

In still other embodiments, the upward optical signal is transmitted to the central office through one optical fiber.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

Figure 1:
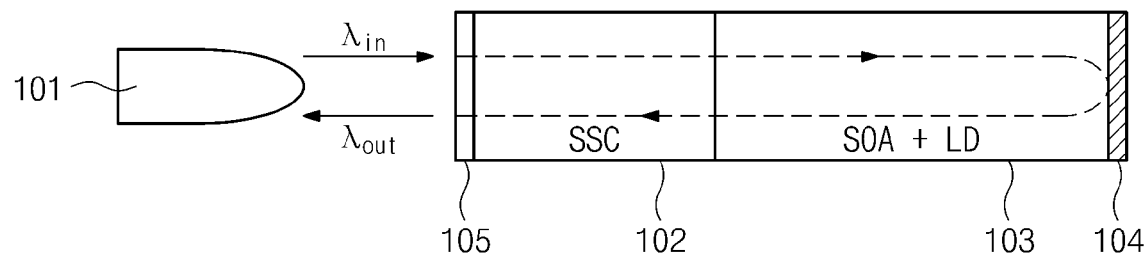
FIG. 1 is a conceptual diagram of a RSOA according to an embodiment of the present invention.

FIG. 1 is a conceptual diagram of a Reflective Semiconductor Optical Amplifier (RSOA) according to an embodiment of the present invention.

Referring to FIG. 1, the RSOA includes a Spot-Size Converter (SSC) 102 and an amplification modulation region 103. The amplification modulation region 103 may include a Semiconductor Optical Amplifier (SOA) and a Laser Diode (LD). The SSC, the SOA, and the LD may be optically connected to each other through a butt joint.

An anti-reflective layer 105, optically connected to an optical fiber 101, may be disposed on one end of the SSC 102 in order to reduce light reflection. The RSOA may be connected to a central office through one optical fiber 101 in order to reduce a manufacturing cost. For this, a high reflective layer 104 for reflecting an incident light is disposed on one end of the amplification modulation region 103, facing the anti-reflective layer 105.

A downward optical signal $\lambda_{in}$ incident from the optical fiber 101 to the amplification modulation region 103 is amplified through an optical gain according to a modulation of a current inputted into the amplification modulation region 103, and then is reflected by the high reflective layer 104 to be transmitted as an upward optical signal $\lambda_{out}$ of the optical fiber 101.

Figure 2:
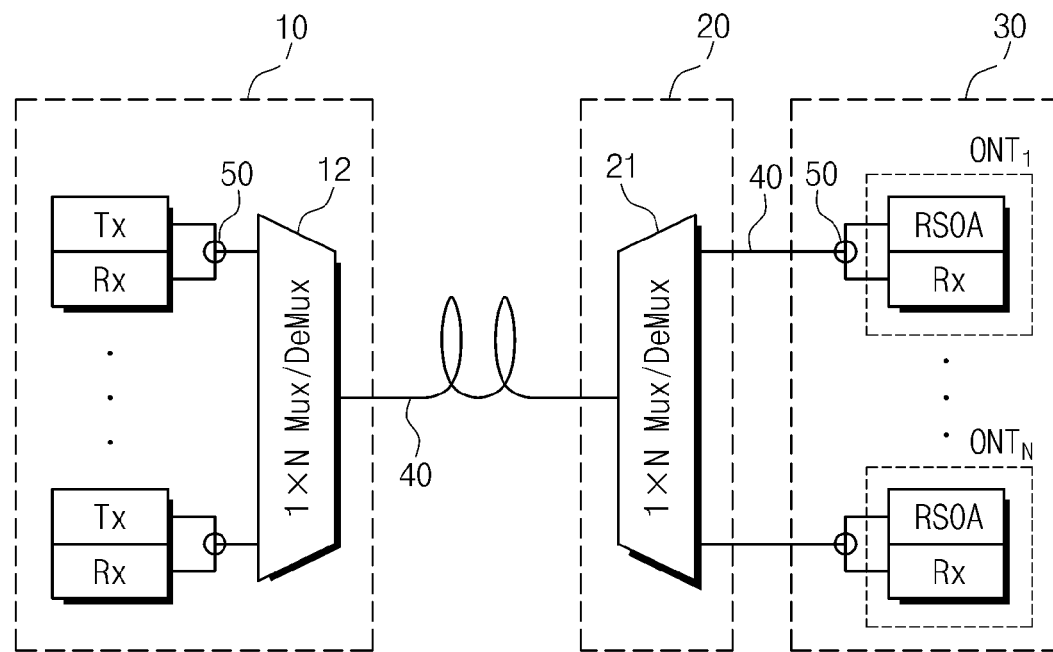
FIG. 2 is a block diagram illustrating a WDM-PON based on a RSOA according to an embodiment of the present invention.

FIG. 2 is a block diagram illustrating a Wavelength Division Multiplexed-Passive Optical Network (WDM-PON) based on a RSOA according to an embodiment of the present invention. Referring to FIG. 2, the WDM-PON includes a central office (CO) 10, an optical fiber 40, a remote node 20, and an Optical Network Terminal (ONT) 30. The ONT 30 may include a plurality of ONTs $ONT_1 \ldots ONT_N$.

The CO 10 includes an optical source unit Tx for transmitting the downward optical signal, an optical receiving unit Rx for receiving the upward optical signal, an optical coupler/distributor 50, and an optical multiplexer/de-multiplexer (Mux/DeMux) 12. In general, a single mode optical source (e.g., Distributed FeedBack (DFB)-LD)) is used as the Tx of the CO 10.

The downward optical signal is inputted to the remote node 20 through the optical fiber 40, and is divided by each wavelength through an optical Mux/DeMux 21 of the remote node 20. Then, the downward optical signal divided by each wavelength is transmitted into the plurality of independent ONTs. Each of the ONTs may include an optical coupler/distributor 50, a RSOA for transmitting the upward optical signal as an optical source, and an Rx for receiving the downward optical signal. The upward optical signal modulated in the RSOA is inputted to the CO 10 through the remote node 20 and the optical fiber 40. According to embodiments of the present invention, since the RSOA is configured to have a resonant structure and utilize a cross gain modulation, a high speed operating characteristic can be provided.

Figure 3:
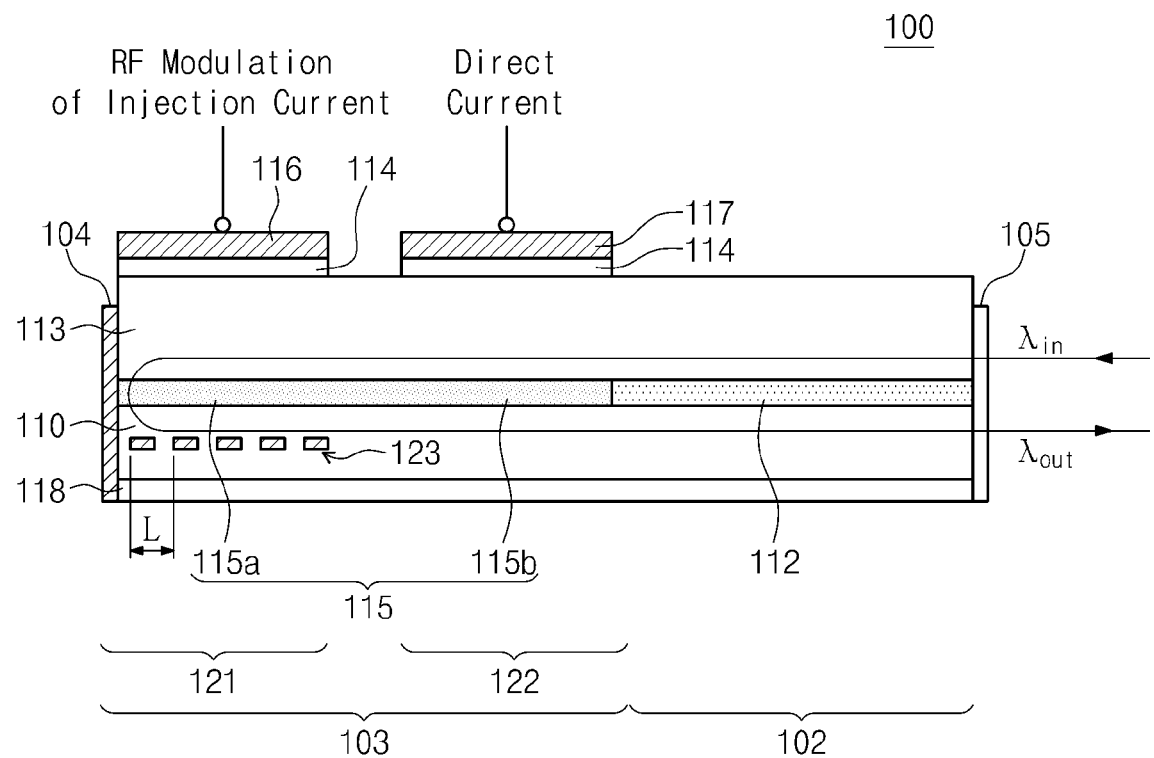
FIG. 3 is a cross-sectional view illustrating a RSOA according to an embodiment of the present invention.

FIG. 3 is a cross-sectional view illustrating a RSOA 100 according to one embodiment of the present invention.

An amplification modulation region 103 may include a SOA 122 and an LD 121. The SSC 102 may include a passive waveguide 112 for improving an optical coupling efficiency with an optical fiber 101 and the amplification modulation region 103 may include a gain waveguide 115 for converting an optical signal.

The passive waveguide 112 and the gain wave guide 115 may be provided on a substrate 110. A clad layer 113 is provided on the substrate 110, the passive waveguide 112, and the gain waveguide 115. The passive waveguide 112 and the gain waveguide 115 may be surrounded by the clad layer 113 and the substrate 110. The gain waveguide 115 may include a first gain waveguide 115a and a second gain waveguide 115b. The first gain waveguide 115a may constitute the LD 121 and the second gain waveguide 115b constitute the SOA 122.

A first upper electrode 116 is provided on the clad layer 113 above the LD 121, and a second upper electrode 117 is provided on the clad layer 113 above the SOA 122. Each ohmic layer 114 is provided between the clad layer 113 and the first and second upper electrodes 116 and 117. A lower electrode 118 is provided below the substrate 110. The first and second upper electrodes 116 and 117 are separated from each other and then used as upper electrodes of the LD 121 and the SOA 122. Accordingly, the LD 121 and the SOA 122 may be configured to have possible independent current injection.

The LD 121 may be a DFB-LD. A diffraction grating constituting the LD 121 may be provided above or below the first gain waveguide 115a. Likewise, according to embodiments of the present invention, the LD 121 may include a resonant structure allowing cross gain modulation through a Radio Frequency (RF) modulation of an injection current. Accordingly, the RSOA according to embodiments of the present invention has a resonant frequency and also operates at a high speed of more than about 1.25 Gbps or about 2.5 Gbps, which is far faster than about 1.25 Gbps.

The substrate 110 may be formed of n-InP. The gain waveguide 115 may be formed of InGaAsP where a band gap of a bulk or quantum well structure is about 1.55 µm. The passive waveguide 112 may be formed of InGaAsP where a band gap is about 1.1 µm to 1.3 µm. The clad layer 113 may be formed of p-InP, and the ohmic layer 114 may be formed of $p^+$-InGaAs. A current blocking structure limiting a path of a current injected from the upper electrodes 116 and 117 may be formed around the gain waveguide 115 in the clad layer 113. The current blocking structure may be a buried heterostructure formed of at least one of p-InP and n-InP. A high reflective layer 104 and the anti-reflective layer 105 may have a stacked layer of a titanium oxide layer and a silicon oxide layer and may have an appropriate thickness with respect to a wavelength of light.

Figure 4:
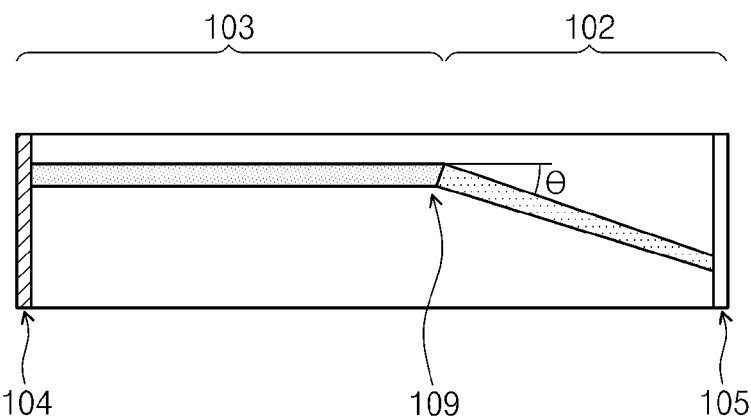
FIG. 4 is a cross-sectional view illustrating a RSOA according to an embodiment of the present invention.

Referring to FIG. 4, the passive waveguide of a SSC 102 may be diagonally formed at a an angle θ of about 5° to about 30° with respect to the anti-reflective layer 105, in order to provide more reduced facet reflectivity. Furthermore, the passive waveguide 112 may be tapered to have a width similar to an optical mode of the optical fiber 101, such that optical coupling efficiency is improved. The SSC 102 and the amplification modulation region 103 may be optically connected to each other through a butt joint 109.

Figure 5A:
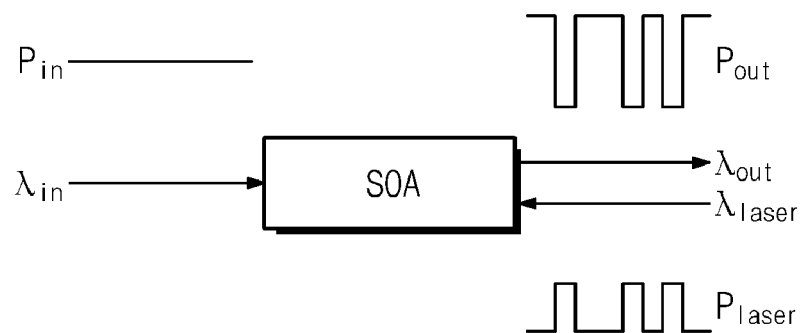
FIGS. 5A and 5B are views illustrating a cross gain modulation in a SOA according to an embodiment of the present invention.
Figure 5B:
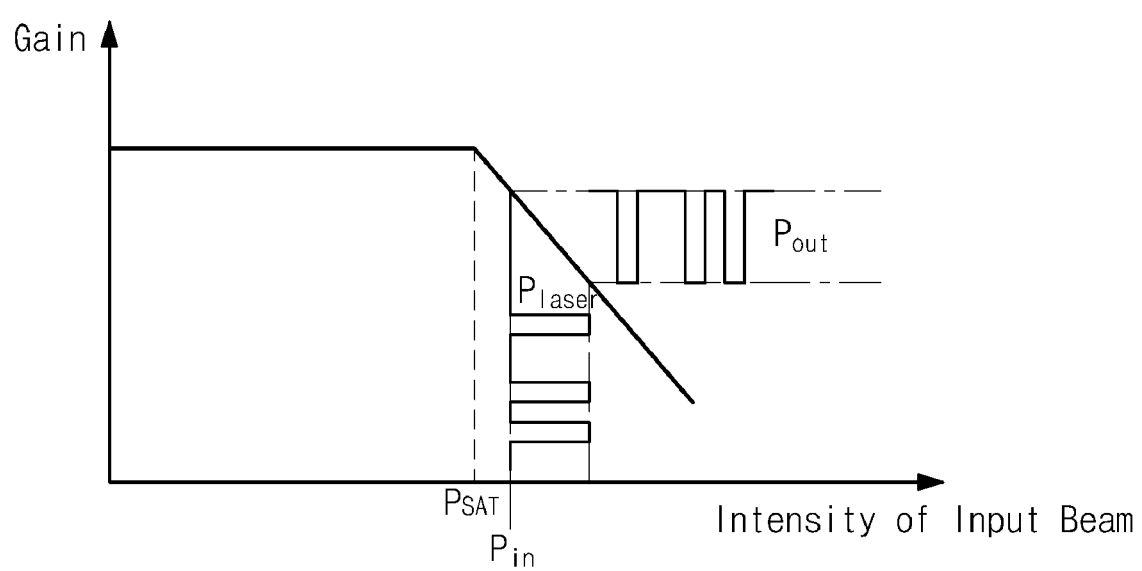

FIGS. 5A and 5B are views illustrating a cross gain modulation in a SOA according to an embodiment of the present invention. FIG. 5A illustrates a downward optical signal $\lambda_{in}$, an upward optical signal $\lambda_{out}$, and a modulated laser signal $\lambda_{laser}$ in the SOA. $P\_\lambda_{in}$, $P\_\lambda_{out}$, and $P\_\lambda_{laser}$ represent an intensity of the downward optical signal, an intensity of an upward optical signal, and an intensity of a modulated layer signal, respectively, and a horizontal-axis represents time. In FIG. 5B, an x-axis represents an intensity of an input beam (e.g., the incident optical signal) and a y-axis represents an intensity amplification rate (i.e., a gain) of an output light (e.g., an upward optical signal) with respect to the input light.

Referring to FIGS. 5A and 5B, when a current of a predetermined amplitude is injected in the SOA, a gain is uniform at a low light intensity but is gradually decreased at above a saturation input light intensity $P_{SAT}$. This is called a gain saturation phenomenon. A continuous wave (CW) having a uniform intensity, i.e., the downward optical signal $\lambda_{in}$, and a laser signal $\lambda_{laser}$ having the modulated light intensity may be simultaneously injected in the SOA. A gain of the CW may be reduced due to the modulated light intensity. Especially, the gain reduction of the CW downward optical signal $\lambda_{in}$ is more clearly shown if the intensity sum of the downward signal $\lambda_{in}$ and the modulated light is more than the saturation input light intensity $P_{SAT}$ in the SOA. Therefore, the CW downward optical signal $\lambda_{in}$ may be modulated to have information of a laser signal $\lambda_{laser}$ having a modulated light intensity while passing through the SOA. This process is called a cross Gain Modulation (XGM).

The XGM is used for including information of the modulated light in another wavelength light. The XGM is effective at a high speed of more than about 40 Gbps. Accordingly, the RSOA using the XGM according to another embodiment of the present invention can provide a high speed operating characteristic.

Referring to FIG. 1 to FIGS. 5A and 5B, according to embodiments of the present invention, a current of a predetermined amplitude can be injected into the SOA 122 and in this case, the downward optical signal may obtain a gain. The LD 121 is configured to modulate the downward optical signal and for this, a modulated current is inputted. Information of the modulated laser signal generated in the LD 121 can be transmitted in the downward optical signal from the CO 10, through the XGM. The upward optical signal generated through this process is reflected by the high reflective layer 104, and then is transmitted into the CO 10 through the optical fiber 101. As well-known, the XGM is effective at an operating speed of about 40 Gbps. Consequently, each ONT can transmit the upward optical signal of more than about 10 Gbps to the CO 10 through the RSOA according to one embodiment of the present invention.

For effective laser oscillation, an oscillation wavelength λ of the LD 121 may be within a gain band width of the SOA 122. Furthermore, for effective filtering of a modulated wavelength (performed in an optical MuX/DeMux in a remote node and a central office), the oscillation wavelength λ may be a wavelength that is not used in a corresponding optical network (i.e., different from the wavelength band of the downward and upward optical signals). That is, the oscillation wavelength λ may be selected not to overlap a wavelength band used in another ONT. As well-known, the oscillation wavelength λ of the LD 121 can be adjusted by changing the grating interval L of the diffraction grating 123 as shown in Equation below. Accordingly, the above-mentioned required wavelength band may be effectively selected by changing the interval L of the diffraction grating 123. An effective refractive index $n_{eff}$ can be calculated including refractive indexes of a waveguide and an adjacent region through a light expanding and progressing to the waveguide and the adjacent region.

$$\lambda = L \cdot 2n_{eff} \text{ (λ: oscillation wavelength, } L \text{: pitch of diffraction grating, } n_{eff} \text{: effective refractive index)}$$

Figure 6:
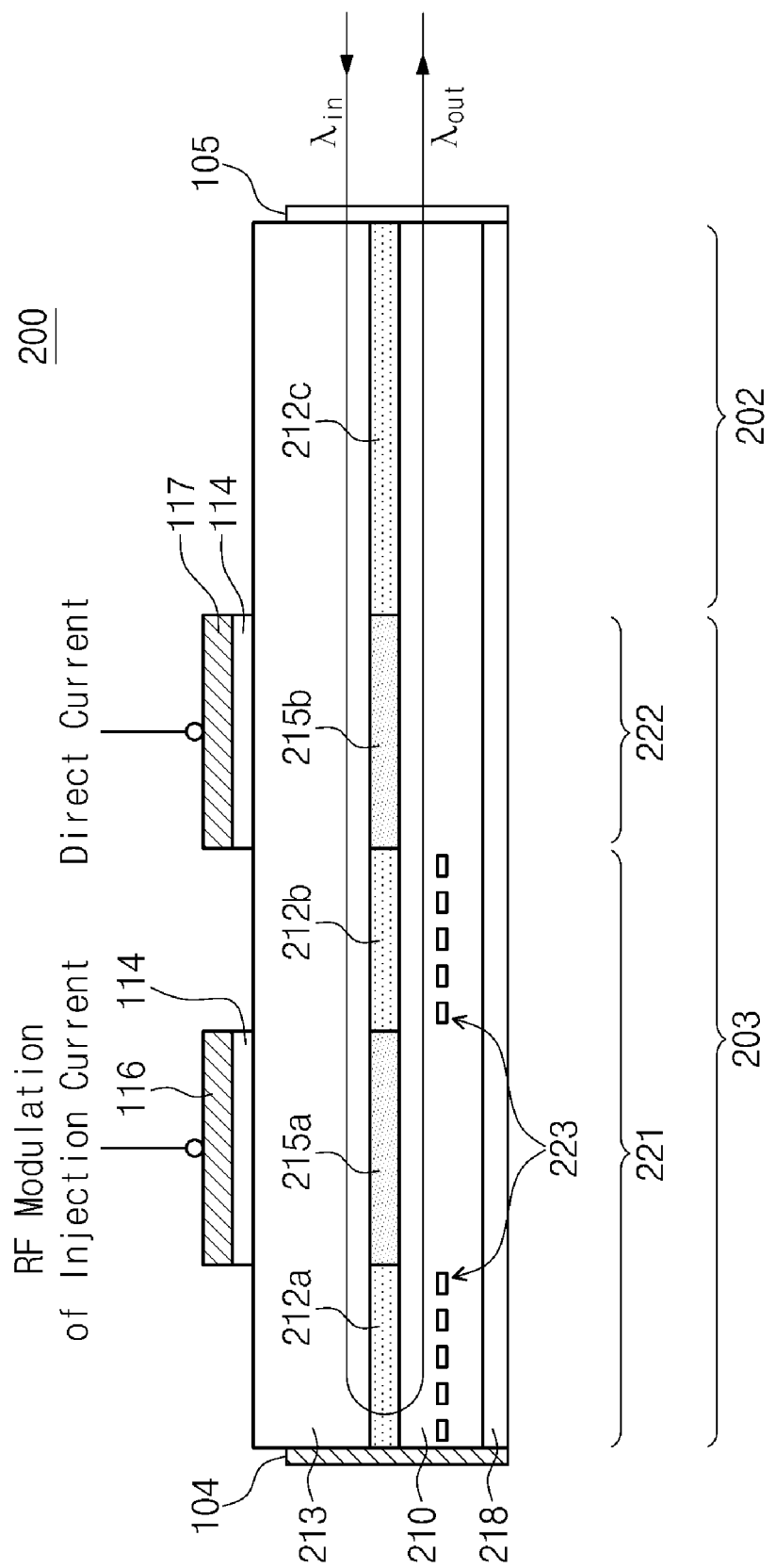
FIGS. 6 and 7 are cross-sectional views illustrating a RSOA according to other embodiments of the present invention.
Figure 7:
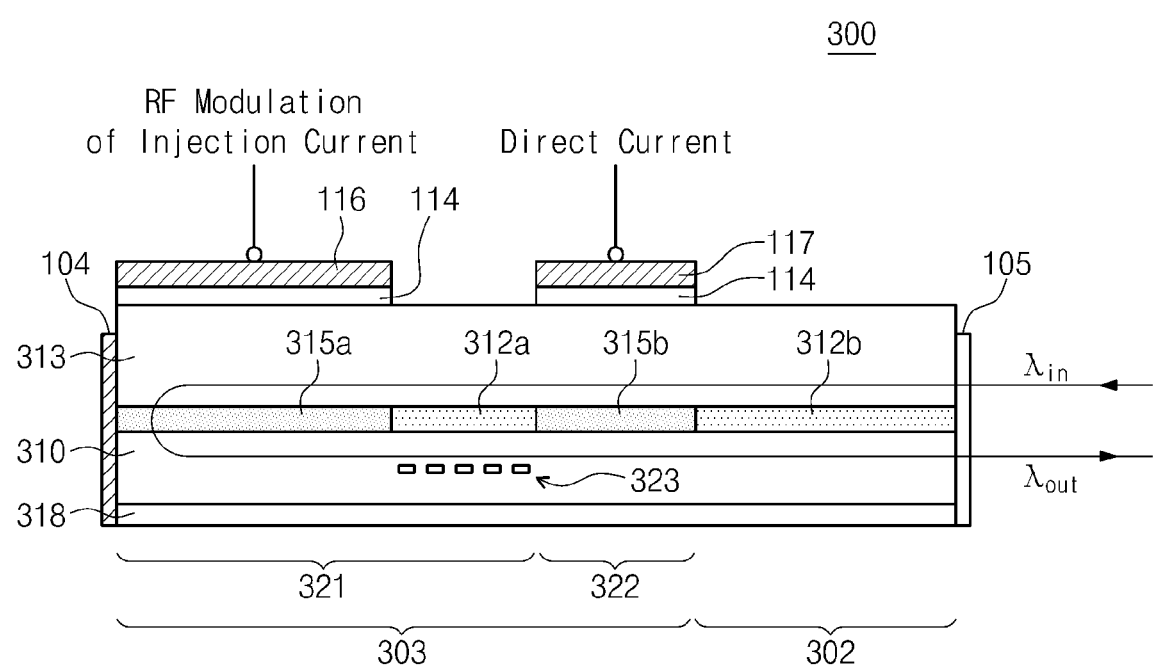

FIGS. 6 and 7 are cross-sectional views illustrating a RSOA according to other embodiments of the present invention. An LD may be a Distributed Bragg Reflector (DBR)-LD. Except for a structure and disposition based on a difference between the DBR-LD and the DFB-LD of the above-mentioned embodiment, technical features related to the DFB laser are similarly or identically applicable to the DBR-LD. Accordingly, for concise description, overlapping technical features may be omitted because their functions and features are similar or identical even when different numerical references are used.

Referring to FIG. 6, a RSOA 200 according to another embodiment of the present invention may include a SSC 202 and an amplification modulation region 203. The amplification modulation region 203 may include a SOA 222 and a DBR-LD 221.

Between a high reflective layer 104 and an anti-reflective layer 105, a first passive waveguide 212a, a first gain waveguide 215a, a second passive waveguide 212b, a second gain waveguide 215b, and a third passive waveguide 212c may be disposed alternately. The first gain waveguide 215a and the first and second passive waveguides 212a and 212b at the both sides of the first gain waveguide 215a constitutes the DBR-LD and the second gain waveguide 215b constitutes the SOA 222. In order to realize the DBR-LD, a resonant structure such as a diffraction grating 223 may be disposed above or below the first and second passive waveguides 212a and 212b.

As mentioned above, an oscillation wavelength of the DBR-LD 221 may be a wavelength band which is within a gain band width of the SOA 222 and is not used in a corresponding optical network (i.e., different from a wavelength band of the downward optical signal and the upward optical signal. Technical requirements related to the above oscillation wavelength may be accomplished through an adjustment of an interval of the diffraction grating 223.

Referring to FIG. 7, the RSOA 300 according to further another embodiment of the present invention may include a SSC 302 and an amplification modulation region 303. The amplification modulation region 303 may include a SOA 322 and a DBR-LD 321.

Between a high reflective layer 104 and an anti-reflective layer 105, a first gain waveguide 315a, a first passive waveguide 312a, a second gain waveguide 315b, and a second passive waveguide 312b are disposed alternately. The first gain waveguide 315a and the first passive waveguide 312a constitute DBR-LD and the second gain waveguide 315b constitutes the SOA 322. In some embodiment of the inventive concept, the third passive waveguide 312b may constitute the SOA 322. In order to realize the DBR-LD 321, a resonant structure such as the diffraction grating 323 may be disposed above or below the first passive waveguide 312a.

As mentioned above, an oscillation wavelength of the DBR-LD 321 may be a wavelength band which is within a gain band width of the SOA 322 and is not used in a corresponding optical network (i.e., different from a wavelength band of the downward optical signal and the upward optical signal. Technical requirements related to the above oscillation wavelength may be accomplished through an adjustment of an interval of the diffraction grating 323.

According to above-mentioned embodiments of the present invention, a single mode operating optical source and a RSOA are integrated together. The single mode operating optical source may be directly modulated up to an operating speed of about 10 Gbps and a cross gain modulation is effective at an operating speed of about 40 Gbps. The RSOA according to the embodiments of the present invention may be realized at an operating speed of more than about 10 Gbps. Furthermore, since the RSOA according to the embodiments of the present invention is a reflective type using one optical fiber, a system using the same may be realized with a low cost.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A reflective semiconductor optical amplifier comprising:
    an optical signal amplification region operating to allow a downward optical signal incident from the external to obtain a gain; and
    an optical signal modulation region connected to the optical signal amplification region and generating a modulated optical signal,
    wherein the downward optical signal is amplified through a cross gain modulation using the modulated optical signal and is outputted as an upward optical signal,
    wherein the optical signal amplification region comprises a semiconductor amplifier and the optical signal modulation region comprises a laser diode, and
    wherein an oscillating wavelength band of the laser diode is included in a gain band of the semiconductor amplifier and is different from that of the downward optical signal.

2. The reflective semiconductor optical amplifier of claim 1, wherein
    the optical signal amplification region and the optical signal modulation region comprise a first electrode and second electrode, respectively, the first electrode and second electrode being configured to allow independent current injection.

3. The reflective semiconductor optical amplifier of claim 2, wherein a direct current is applied to the first electrode of the optical signal amplification region and a Radio Frequency (RF) current is applied to the second electrode of the optical signal modulation region.

4. The reflective semiconductor optical amplifier of claim 3, wherein the optical signal modulation region generates an optical signal modulated by the RF current, and the optical signal amplification region performs the cross-gain modulation on the downward optical signal using the modulated optical signal and then outputs the cross-gain modulated downward optical signal as an upward optical signal.

5. The reflective semiconductor optical amplifier of claim 1, wherein the optical signal modulation region comprises a diffraction grating.

6. The reflective semiconductor optical amplifier of claim 5, wherein the optical signal modulation region generates a light of a single wavelength.

7. The reflective semiconductor optical amplifier of claim 1, further comprising:
    an anti-reflective layer disposed adjacent to the optical signal amplification region; and
    a reflective layer disposed adjacent to the optical signal modulation region,
    wherein the optical signal amplification region and the optical signal modulation region are interposed between the anti-reflective layer and the reflective layer.

8. The reflective semiconductor optical amplifier of claim 7, wherein the anti-reflective layer is used as a path receiving the incident downward optical signal and outputting the upward optical signal.

9. The reflective semiconductor optical amplifier of claim 8, further comprising a spot-size converter interposed between the optical signal amplification region and the anti-reflective layer, wherein the anti-reflective layer is optically connected to one optical fiber.

10. A reflective semiconductor optical amplifier comprising:
    an anti-reflective layer serving as an input/output path of light;
    a reflective layer spaced apart from the anti-reflective layer, the reflective layer reflecting the light; and
    an optical amplification modulation region having a resonant structure between the anti-reflective layer and the reflective layer, the optical signal modulation region including a diffraction grating.

11. The reflective semiconductor optical amplifier of claim 10, wherein the resonant structure of the optical amplification modulation region generates a resonant frequency of a single wavelength.

12. The reflective semiconductor optical amplifier of claim 10, wherein the optical amplification modulation region comprises a semiconductor amplifier operating to allow a light to obtain a gain and a laser diode generating a modulated signal, the semiconductor amplifier and the laser diode being connected in series.

13. The reflective semiconductor optical amplifier of claim 12, wherein a band of an oscillation wavelength of the laser diode is included in a gain band of the semiconductor amplifier and is different from a wavelength band of the light.

14. A method for processing an optical signal of a wavelength division multiplexed-passive optical network (WDM-PON) including a central office and an optical network terminal, the method comprising:
  providing a reflective semiconductor optical amplifier that includes an optical signal amplification region and an optical signal modulation region connected to the optical signal amplification region, the optical signal amplification region including a semiconductor amplifier, the optical signal modulation region including a laser diode having oscillating wavelength band in a gain band of the semiconductor amplifier;
  receiving a downward optical signal from the central office, the laser diode having an oscillating wavelength band different from a wavelength band of the received downward optical signal;
  directing the received downward optical signal to be incident on the optical signal amplification region;
  generating a modulated optical signal by the optical signal modulation region; and
  amplifying the received downward optical signal by the optical signal amplification region through a cross gain modulation using the modulated optical signal and outputting the amplified downward optical signal as an upward optical signal.

15. The method of claim 14, wherein a wavelength band of the modulated optical signal is another wavelength band that is not used in the WDM-PON.

16. The method of claim 14, wherein the upward optical signal is transmitted to the central office through one optical fiber.

17. A method for processing an optical signal of a wavelength division multiplexed-passive optical network (WDM-PON) including a central office and an optical network terminal, the method comprising
  providing a reflective semiconductor optical amplifier that includes an anti-reflective layer serving as an input/output path of light, a reflective layer spaced apart from the anti-reflective layer, the reflective layer reflecting the light, and an optical amplification modulation region having a resonant structure between the anti-reflective layer and the reflective layer, the optical signal modulation region including a diffraction grating;
  receiving by the reflective semiconductor optical amplifier a downward optical signal from the central office;
  generating a modulated optical signal in the reflective semiconductor optical amplifier; and
  amplifying the downward optical signal in the optical amplification modulation region of the reflective semiconductor optical amplifier through a cross gain modulation using the modulated optical signal and outputting the amplified downward optical signal as an upward optical signal.

* * * * *